(12) United States Patent
    Matsui et al.

(10) Patent No.: US 9,799,808 B2
(45) Date of Patent: Oct. 24, 2017

(54) LIGHT EMITTING ELEMENT AND LIGHT EMITTING ELEMENT PACKAGE

(71) Applicant: ROHM CO., LTD., Kyoto (JP)

(72) Inventors: Nobuaki Matsui, Kyoto (JP); Seiji Kamida, Kyoto (JP); Tadateru Shibata, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 87 days.

(21) Appl. No.: 14/159,578

(22) Filed: Jan. 21, 2014

(65) Prior Publication Data
    US 2014/0203318 A1    Jul. 24, 2014

(30) Foreign Application Priority Data

Jan. 21, 2013 (JP) ................. 2013-008772

(51) Int. Cl.
    *H01L 33/62*    (2010.01)
    *H01L 33/60*    (2010.01)
    *H01L 33/44*    (2010.01)
    *H01L 33/46*    (2010.01)

(52) U.S. Cl.
    CPC .............. *H01L 33/60* (2013.01); *H01L 33/44* (2013.01); *H01L 33/46* (2013.01)

(58) Field of Classification Search
    CPC .......... H01L 33/46; H01L 33/60; H01L 33/10
    See application file for complete search history.

(56) References Cited

U.S. PATENT DOCUMENTS

| 2012/0049228 | A1* | 3/2012 | Walter et al. ............... 257/98 |
| 2012/0280263 | A1* | 11/2012 | Ibbetson et al. ............ 257/98 |
| 2012/0326159 | A1* | 12/2012 | Bergmann et al. ......... 257/76 |
| 2013/0056748 | A1* | 3/2013 | Matsui .................. H01L 33/22 257/76 |

FOREIGN PATENT DOCUMENTS

| JP | 2005-072148 A | 3/2005 |
| JP | 2010-232687 A | 10/2010 |
| JP | 2012-525693 A | 10/2012 |
| JP | 2012-216753 A | 11/2012 |
| WO | WO 2010-125792 A1 | 11/2010 |
| WO | WO 2011162367 A1 * | 12/2011 ........... H01L 33/42 |

* cited by examiner

*Primary Examiner* — Peniel Gumedzoe
*Assistant Examiner* — Christopher Johnson
(74) *Attorney, Agent, or Firm* — Rabin & Berdo, P.C.

(57) ABSTRACT

A light emitting element includes: a sapphire substrate having a front surface and a rear surface opposite the front surface; a first conductive type semiconductor layer stacked on the front surface of the sapphire substrate; a light emitting layer stacked on the first conductive type semiconductor layer; a second conductive type semiconductor layer stacked on the light emitting layer; a reflective layer which contains Ag and is disposed on the rear surface of the sapphire substrate, the reflective layer reflecting light from the sapphire substrate toward the front surface of the sapphire substrate; and an adhesive layer which is interposed between the sapphire substrate and the reflective layer and is made of ITO, the adhesive layer being adhered to the reflective layer.

30 Claims, 10 Drawing Sheets

LIGHT EMITTING ELEMENT AND LIGHT EMITTING ELEMENT PACKAGE

CROSS-REFERENCE TO RELATED APPLICATION

This application is based upon and claims the benefit of priority from Japanese Patent Application No. 2013-8772, filed on Jan. 21, 2013, the entire contents of which are incorporated herein by reference.

TECHNICAL FIELD

The present disclosure relates to a light emitting element and a light emitting element package having the light emitting element covered with a package.

BACKGROUND

A semiconductor device has a structure in which a semiconductor element is die-bonded to a mounting substrate by die bonding material. The semiconductor element is an LED (Light Emitting Device) and has a structure including an n-type GaN contact layer, a light emitting layer, a p-type AlGaN clad layer and a p-type GaN contact layer, which are epitaxially grown and stacked in this order on a crystalline substrate such as a sapphire substrate. The rear surface of the crystalline substrate is metalized by a metal laminate including a reflective layer and protective layer. The reflective layer may be made of, for example, Al or the like. When light from the light emitting layer is directed to the rear side of the crystalline substrate, the light is reflected by the reflective layer toward the front surface of the crystalline substrate.

SUMMARY

A light et fitting element requires increased brightness (high luminance), increased adhesion between adjacent layers, and increased dissipation of heat generated in the light emission (high heat dissipation). The present disclosure provides some embodiments of a light emitting element and a light emitting element package which are capable of achieving high brightness and increased adhesion. The present disclosure provides some embodiments of a light emitting element and a light emitting element package which are capable of achieving high heat dissipation.

According to one embodiment of the present disclosure, there is provided a light emitting element including: a sapphire substrate having a front surface and a rear surface in the opposite side of the front surface; a first conductive type semiconductor layer stacked on the front surface of the sapphire substrate; a light emitting layer stacked on the first conductive type semiconductor layer; a second conductive type semiconductor layer stacked on the light emitting layer; a reflective layer which contains Ag and is disposed on the rear surface of the sapphire substrate, the reflective layer reflecting light from the sapphire substrate toward the front surface of the sapphire substrate; and an adhesive layer which is interposed between the sapphire substrate and the reflective layer and is made of ITO, the adhesive layer being adhered to the reflective layer.

With this configuration, light from the light emitting layer can be instantly released from the front surface of the sapphire substrate or may be released from the front surface of the sapphire substrate after once transmitting through the adhesive layer and being reflected by the reflective layer. Since the reflective layer contains Ag higher in reflectance than Al, the reflectance of the reflective layer can be increased and the brightness of the light emitting element can be accordingly increased. On the other hand, by interposing the adhesive layer made of ITO between the Ag-containing reflective layer and the sapphire substrate, it is possible to increase the adhesion between the reflective layer and the sapphire substrate.

The adhesive layer may have a thickness of equal to or less than 20 nm. Accordingly, since the permeability of light in the adhesive layer can be increased, more light can be reflected from the reflective layer and the brightness of the light emitting element can be increased as much. The adhesive layer may adhere the reflective layer to the rear surface of the sapphire substrate. Accordingly, it is possible to increase the adhesion between the reflective layer and the sapphire substrate.

The light emitting element may further include a conductive multi-layered reflecting mirror which is interposed between the sapphire substrate and the adhesive layer and is formed by alternatively stacking two kinds of layers having different refractive indexes, and the adhesive layer may adhere the reflective layer to the conductive multi-layered reflecting mirror. In this case, since the conductive multi-layered reflecting mirror also exists in addition to the reflective layer for light reflection, light reflectance can be increased over the presence of the reflective layer alone and the bright ness of the light emitting element can be further increased as much.

The light emitting element may further include a bonding metal layer which is disposed in the opposite side of the adhesive layer to the reflective layer and contains Au. With this configuration, heat generated from the light emitting element by emission of the light emitting layer can be effectively dissipated by the Au-containing bonding metal layer having a high thermal conductivity. That is, it is possible to achieve high heat dissipation of the light emitting element.

The bonding metal layer may be made of AuSn. The light emitting element may further include a barrier metal layer which is interposed between the reflective layer and the bonding metal layer and is higher in melting point than the bonding metal layer. With this configuration, the barrier metal layer can prevent an ingredient of the bonding metal layer from being diffused into the reflective layer.

According to another embodiment of the present disclosure, there is provided a light emitting element package including: the above-described light emitting element; and a package covering the light emitting element in such a manner to expose the front surface of the sapphire substrate. The package may include a bonding metal layer which contains Au and is bonded to the reflective layer. In this case, the light emitting element package may further include a barrier metal layer which is interposed between the reflective layer and the bonding metal layer and is higher in melting point than the bonding metal layer. The barrier metal layer can prevent an ingredient of the bonding metal layer from being diffused into the reflective layer. The package may include the barrier metal layer.

DETAILED DESCRIPTION

Figure 1:
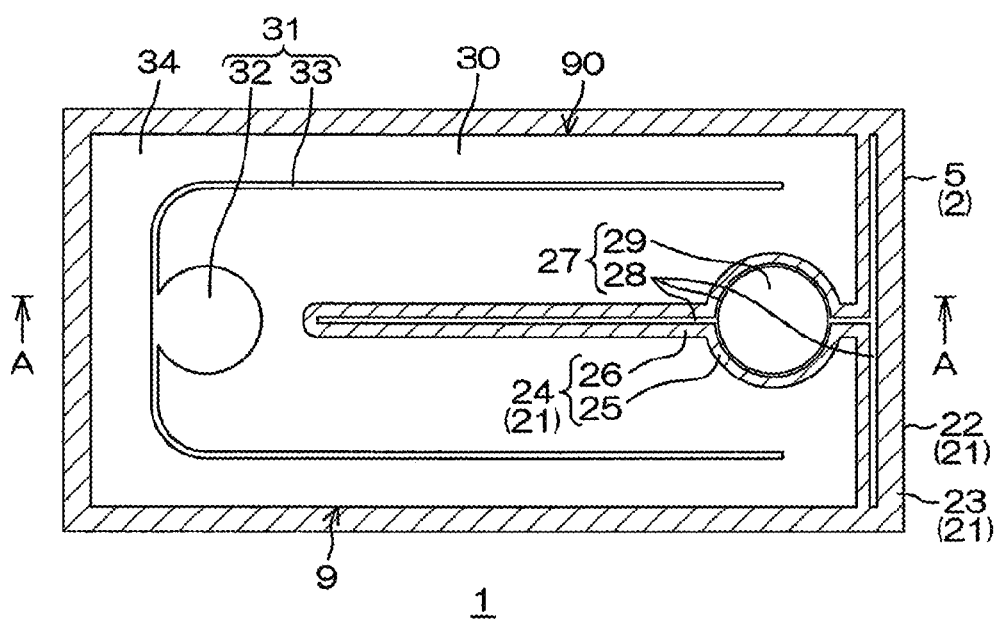
FIG. 1 is a schematic plane view of a light emitting element according to an embodiment of the present disclosure.

Some embodiments of the present disclosure will now be described in detail with reference to the drawings. Throughout the drawings, the same or similar elements, members and processes are denoted by the same reference numerals and explanation of which will not be repeated. The disclosed embodiments are provided for the purpose of illustration, not limitation, of the present disclosure and all features and combinations thereof described in the embodiments cannot be necessarily construed to describe the spirit of the present disclosure.

In the specification, the phrases "connection of a member A and a member B" and "a member A stacked on a member B" is intended to include direct physical connection of the member A and the member B as well as indirect connection thereof via other member as long as the other member has no substantial effect on the electrical connection of the member A and the member B or has no damage to functions and effects shown by a combination of the member A and the member B. Similarly, the phrase "interposition of a member C between a member A and a member B" is intended to include direct connection of the member A and the member C or direct connection of the member B and the member C as well as indirect connection thereof via other member as long as the other member has no substantial effect on the electrical connection of the member A, the member B and the member C or has no damage to functions and effects shown by a combination of the member A, the member B and the member C.

Figure 2:
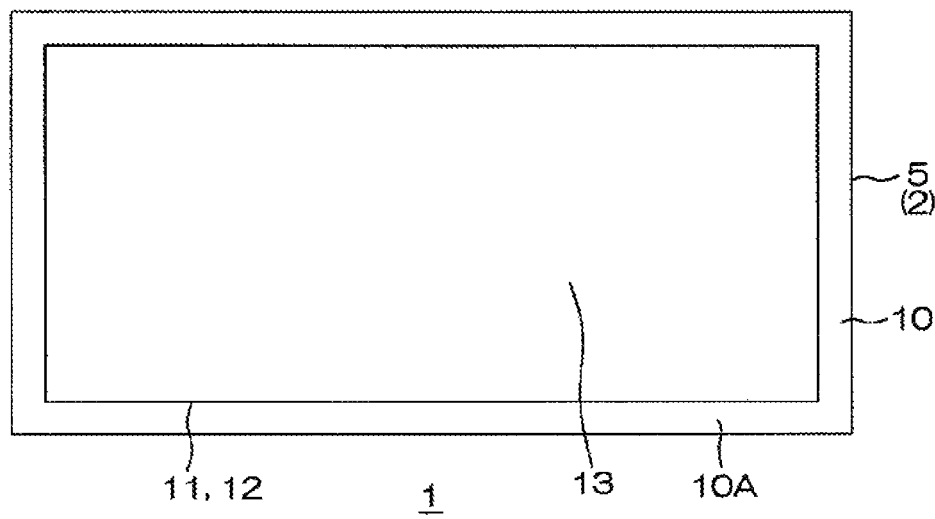
FIG. 2 is a schematic bottom view of the light emitting element of FIG. 1.
Figure 3:
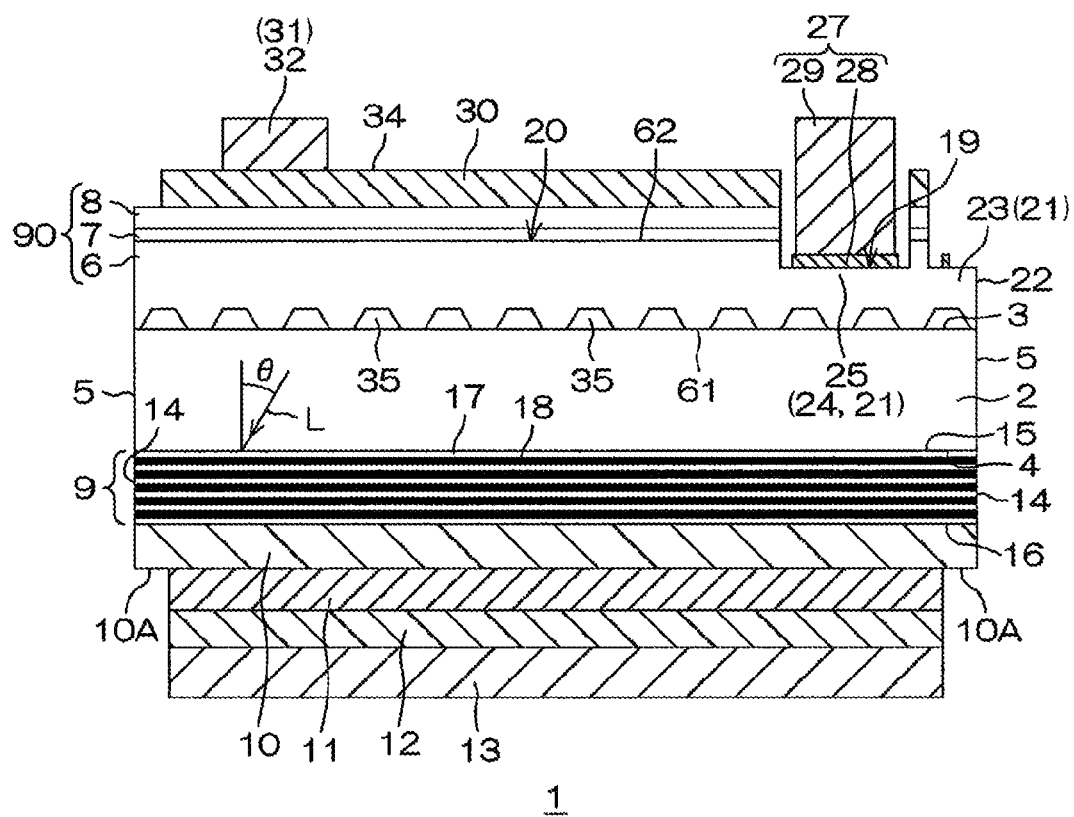
FIG. 3 is a schematic sectional view of the light emitting element of FIG. 1, taken along section line A-A in FIG. 1.

FIG. 1 is a schematic plane view of a light emitting element 1 according to an embodiment of the present disclosure. FIG. 2 is a schematic bottom view of the light emitting element 1 of FIG. 1. FIG. 3 is a schematic sectional view of the light emitting element 1 of FIG. 1, taken along section line A-A in FIG. 1. For example, as shown in FIGS. 1 and 2, the light emitting element 1 has a rectangular chip shape when viewed from top, with its long side being 0.2 mm to 3.0 mm and its short side being 0.1 mm to 2.0 mm.

Referring to FIG. 3, the light emitting element 1 is a so-called two-wire type light emitting element. The light emitting element 1 includes a sapphire substrate 2 having a front surface 3 and a rear surface 4, a first conductive type semiconductor layer 6, a light emitting layer 7 and a second conductive type semiconductor layer 8, with these layers 6, 7 and 8 stacked in this order on the front surface 3 of the sapphire substrate 2. A laminate of the first conductive type semiconductor layer 6, the light emitting layer 7 and the second conductive type semiconductor layers 8 forms a rectangular parallelepiped semiconductor stacked structure 90. The longitudinal direction of the semiconductor stacked structure 90 coincides with the longitudinal direction of the light emitting element 1 (see FIG. 1). In this embodiment, the front surface 3 (an upper surface in FIG. 3) of the sapphire substrate 2 is directed toward a light extraction surface (e.g., a surface 34 in FIG. 3 to be described later) of the light emitting element 1 and the rear surface 4 (a lower surface in FIG. 3) thereof is located opposite to the front surface 3. When light is emitted from the light emitting layer 7, most of the light transmits through the second conductive type semiconductor layer 8 and is extracted from the light extraction surface of the light emitting element 1.

The sapphire substrate 2 is made of sapphire which is a material transparent to an emission wavelength (for example, 450 nm) of the light emitting layer 7. As used herein, the phase "transparent to an emission wavelength" refers to, for example, that a transmittance of an emission wavelength is 60% or more. The sapphire substrate 2 has a thickness of, for example, 200 μm to 300 μm. As used herein, the phase "when viewed from top" refers to when viewed in the thickness direction of the sapphire substrate 2.

On the rear surface 4 of the sapphire substrate 2 are stacked a conductive multi-layered reflecting mirror 9, an adhesive layer 10, a reflective layer 11, a barrier metal layer 12 and a bonding metal layer 13 in this order. The conductive multi-layered reflecting mirror 9 is formed on the entire rear surface 4 of the sapphire substrate 2 such that its side surface (contour) 14 aligns flush with a side surface 5 of the sapphire substrate 2. The conductive multi-layered reflecting mirror 9 has a front surface 15 serving as a surface for bond with the rear surface 4 of the sapphire substrate 2 and corresponding to an upper surface in FIG. 2 and a rear surface 16 serving as a surface for bond with the adhesive layer 10 and corresponding to a lower surface in FIG. 2. That is, the conductive multi-layered reflecting mirror 9 is interposed between the sapphire substrate 2 and the adhesive layer 10.

Figure 4:
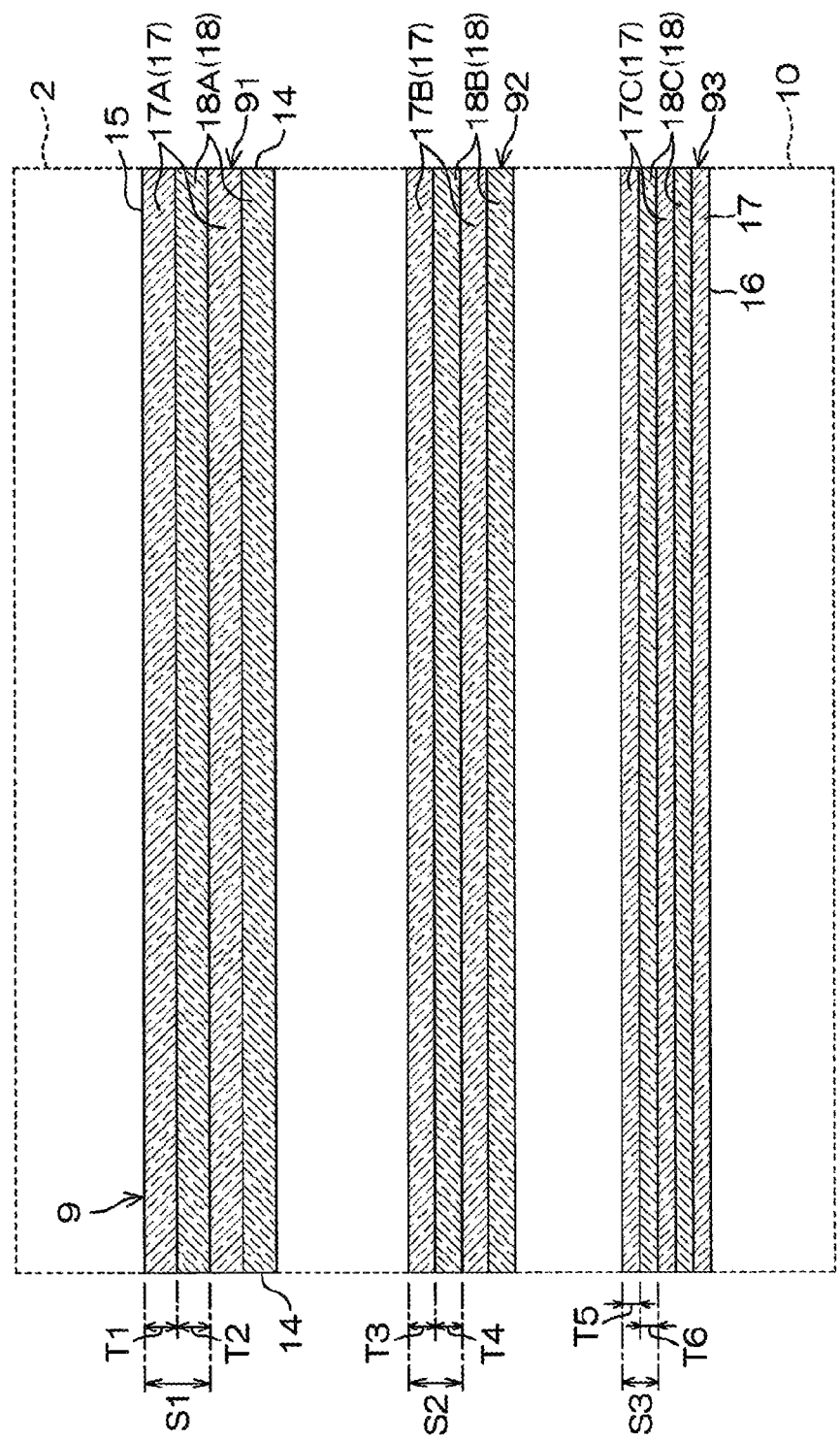
FIG. 4 is a schematic sectional view of a conductive multi-layered reflecting mirror in the light emitting element.

FIG. 4 is a schematic sectional view of the conductive multi-layered reflecting mirror 9 in the light emitting element 1. In FIG. 4, the upper side of the conductive multi-layered reflecting mirror 9 corresponds to the front surface 15 (the sapphire substrate 2 side) and the lower side of the conductive multi-layered reflecting mirror 9 corresponds to the rear surface 16 (the adhesive layer 10 side). The conductive multi-layered reflecting mirror 9 includes two kinds of layers having different refractive indexes, with their respective thickness corresponding to ¼ of a wavelength of light to be reflected, which are alternately stacked, and has a high reflectance of 95% or more. The two kinds of layers may be two selected from a group consisting of $SiO_2$, SiN, $Al_2O_3$, $TiO_2$ and $Ta_2O_5$ layers. In this embodiment, an example of the two kinds of layers may include a $SiO_2$ layer 17 made of $SiO_2$ and a $TiO_2$ layer 18 made of $TiO_2$. The refractive index of SiO₂ is about 1.46 and the refractive index of TiO₂ is about 2.66. Here, the SiO₂ layer 17 is also positioned on the front surface 15 and the rear surface 16 of the conductive multi-layered reflecting mirror 9.

The conductive multi-layered reflecting mirror 9 includes a first multi-layered reflecting mirror portion 91, a second multi-layered reflecting mirror portion 92 and a third multi-layered reflecting mirror portion 93 having different periodic structures (reflection band characteristics). Each of the first multi-layered reflecting mirror portion 91, the second multi-layered reflecting mirror portion 92 and the third multi-layered reflecting mirror portion 93 is a so-called DBR (Distributed Bragg Reflector), or alternatively, may be a multi-layered dielectric mirror structure.

Each of the first multi-layered reflecting mirror portion 91, the second multi-layered reflecting mirror portion 92 and the third multi-layered reflecting mirror portion 93 is formed by stacking the SiO₂ layer 17 and the TiO₂ layer 18 alternately. In the DBR, an optical length (=refractive index of SiO₂ or TiO₂× layer thickness T) of each of the SiO₂ layer 17 and the TiO₂ layer 18 is equal to ¼ of a wavelength of light to be reflected in each multi-layered reflecting mirror portion. Accordingly, in each multi-layered reflecting mirror portion, the thickness T of each of the SiO₂ layer 17 and the TiO₂ layer 18 can be obtained by dividing ¼ of the wavelength of light to be reflected in each multi-layered reflecting mirror portion by the refractive index of SiO₂ or TiO₂.

The first multi-layered reflecting mirror portion 91 is a stacked conductive film formed by stacking the SiO₂ layer 17 having a first layer thickness T1 (a first SiO₂ layer 17A) and the TiO₂ layer 18 having a second layer thickness T2 (a first TiO₂ layer 18A) alternately at several periods. Although the first SiO₂ layer 17A and the first TiO₂ layer 18A overlap with each other layer by layer, the layer thickness is referred to as a first periodic thickness S1 (=T1+T2).

The second multi-layered reflecting mirror portion 92 is a stacked conductive film formed by stacking the SiO₂ layer 17 having a third layer thickness T3 (a second SiO₂ layer 17B) and the TiO₂ layer 18 having a fourth layer thickness T4 (a second TiO₂ layer 18B) alternately at several periods. Although the second SiO₂ layer 17B and the second TiO₂ layer 18B overlap with each other layer by layer, the layer thickness is referred to as a second periodic thickness S2 (=T3+T4).

The third multi-layered reflecting mirror portion 93 is a stacked conductive film formed by stacking the SiO₂ layer 17 having a fifth layer thickness T5 (a third SiO₂ layer 17C) and the TiO₂ layer 18 having a sixth layer thickness T6 (a third TiO₂ layer 18C) alternately at several periods. Although the third SiO₂ layer 17C and the third TiO₂ layer 18C overlap with each other layer by layer, the layer thickness is referred to as a third periodic thickness S3 (=T5+T6).

In the conductive multi-layered reflecting mirror 9, the above-mentioned first layer thickness T1, second layer thickness T2, third layer thickness T3, fourth layer thickness T4, fifth layer thickness T5 and sixth layer thickness T6, and first periodic thickness S1, second periodic thickness S2 and third periodic thickness S3 have a regularity according to one of the following patterns, for example. First pattern: The first layer thickness T1, the third layer thickness T3 and the fifth layer thickness T5 are equal to each other and the second layer thickness T2, the fourth layer thickness T4 and the sixth layer thickness T6 are equal to each other (that is, the first periodic thickness S1, the second periodic thickness S2 and the third periodic thickness S3 are equal to each other). In this case, the first multi-layered reflecting mirror portion 91, the second multi-layered reflecting mirror portion 92 and the third multi-layered reflecting mirror portion 93 have the same configuration.

Second pattern: The first layer thickness T1, the third layer thickness T3 and the fifth layer thickness T5 are different from each other, the second layer thickness T2, the fourth layer thickness T4 and the sixth layer thickness T6 are different from each other, and the first periodic thickness S1, the second periodic thickness S2 and the third periodic thickness S3 are different from each other. In this embodiment, the second pattern is employed, where the first layer thickness T1>the third layer thickness T3>the fifth layer thickness T5, the second layer thickness T2>the fourth layer thickness T4>the sixth layer thickness T6, and the first periodic thickness S1>the second periodic thickness S2>the third periodic thickness S3. For example, the first layer thickness T1 is different from the third layer thickness T3 by about 10% and the third layer thickness T3 is different from the fifth layer thickness T5 by about 10%. In addition, the second layer thickness T2 is different from the fourth layer thickness T4 by about 10% and the fourth layer thickness T4 is different from the sixth layer thickness T6 by about 10%. Accordingly, the first periodic thickness S1 is different from the second periodic thickness S2 by about 10% and the second periodic thickness S2 is different from the third periodic thickness S3 by about 10%.

Third pattern: The first layer thickness T1, the third layer thickness T3 and the fifth layer thickness T5 are different from each other, the second layer thickness T2, the fourth layer thickness T4 and the sixth layer thickness T6 are different from each other, and the first periodic thickness S1, the second periodic thickness S2 and the third periodic thickness S3 are equal to each other. For example, the first layer thickness T1> the third layer thickness T3> the fifth layer thickness T5, the second layer thickness T2< the fourth layer thickness T4< the sixth layer thickness T6, and the first periodic thickness S1=the second periodic thickness S2=the third periodic thickness S3.

In FIG. 4, although the first multi-layered reflecting mirror portion 91, the second multi-layered reflecting mirror portion 92 and the third multi-layered reflecting mirror portion 93 are stacked in this order to be closer to the sapphire substrate 2, a stack order of the first multi-layered reflecting mirror portion 91, the second multi-layered reflecting mirror portion 92 and the third multi-layered reflecting mirror portion 93 may be appropriately changed. In addition, although the conductive multi-layered reflecting mirror 9 of FIG. 4 has three multi-layered reflecting mirror portions, i.e., the first multi-layered reflecting mirror portion 91, the second multi-layered reflecting mirror portion 92 and the third multi-layered reflecting mirror portion 93, the number of multi-layered reflecting mirror portions constituting the conductive multi-layered reflecting mirror 9 may be set arbitrarily if the conductive multi-layered reflecting mirror 9 has a plurality of (two or more) multi-layered reflecting mirror portions.

FIG. 3 schematically shows the conductive multi-layered reflecting mirror 9 including the SiO₂ layer 17 and the TiO₂ layer 18 stacked alternately in a stripe pattern. The adhesive layer 10 is formed on the entire rear surface 16 of the conductive multi-layered reflecting mirror 9. Accordingly, when viewed from top, the conductive multi-layered reflecting mirror 9 and the adhesive layer 10 are formed in the same pattern to be consistent with the rear surface 16 of the conductive multi-layered reflecting mirror 9 and a region of the conductive multi-layered reflecting mirror 9 coincides with a region of the adhesive layer 10.

As described above, the conductive multi-layered reflecting mirror 9, the adhesive layer 10, the reflective layer 11, the barrier metal layer 12 and the bonding metal layer 13 are stacked in this order on the rear surface 4 of the sapphire substrate 2. Accordingly, the reflective layer 11 is stacked on the opposite side (a lower side in FIG. 3) of the conductive multi-layered reflecting mirror 9 to the adhesive layer 10. The barrier metal layer 12 is stacked on the opposite side (a lower side in FIG. 3) of the adhesive layer 10 to the reflective layer 11. The bonding metal layer 13 is stacked on the opposite side (a lower side in FIG. 3) of the reflective layer 11 to the barrier metal layer 12. That is, the adhesive layer 10 is interposed between the sapphire substrate 2 and the reflective layer 11. The reflective layer 11 is disposed on the rear surface 4 side of the sapphire substrate 2. The barrier metal layer 12 and the bonding metal layer 13 are disposed on the opposite side of the adhesive layer 10 to the reflective layer 11. The barrier metal layer 12 is interposed between the reflective layer 11 and the bonding metal layer 13.

Figure 5:
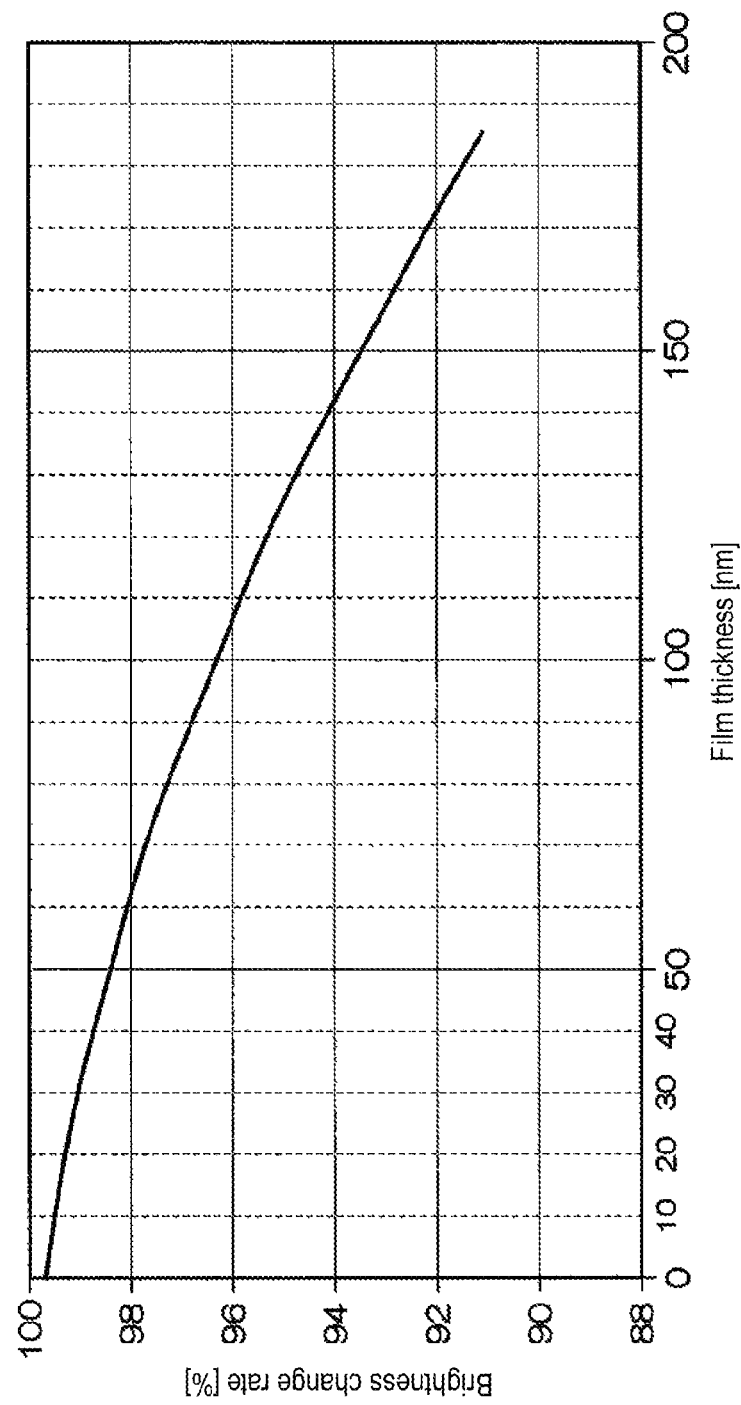
FIG. 5 is a graph showing a relationship between a brightness change rate in the light emitting element and a thickness (film thickness) of an adhesive layer.

The adhesive layer 10 is made of ITO (Indium Tin Oxide) which is a material transparent to the emission wavelength of the light emitting layer 7. The adhesive layer 10 is adhered to the reflective layer 11. The reflective layer 11 is adhered to the conductive multi-layered reflecting mirror 9 via the adhesive layer 10. There is a correlation between the thickness of the adhesive layer 10 and the brightness of the light emitting element 1. FIG. 5 shows a relationship between the brightness change rate in the light emitting element 1 and the thickness (film thickness) of the adhesive layer 10. The brightness change rate becomes closer to 100% as the brightness becomes higher, Referring to FIG. 5, since the brightness change rate is decreased with an increase in the thickness (film thickness) of the adhesive layer 10, the thickness of the adhesive layer 10 is set to 20 nm or less, more specifically, 10 nm or less to allow the brightness change rate to be close to 100%. Referring to FIG. 3 again, as will be described in a method of manufacturing the light emitting element 1, as a matter of convenience of preparing the configuration of the front surface 3 side (the semiconductor stacked structure 90 and so on) of the sapphire substrate 2 and then preparing the configuration of the rear surface side of the sapphire substrate 2, the adhesive layer 10 cannot be formed at a specific temperature or higher in order to prevent the configuration of the front surface 3 side from being thermally damaged. Accordingly, since the adhesive layer 10 has a very thin thickness of 20 nm or less, although not fully transparent, it has become difficult to absorb light and the adhesive layer 10 has little effect on the brightness. Further, in order to prevent the adhesive layer 10 from having an effect on the reflectance of the conductive multi-layered reflecting mirror 9, the interface between the adhesive layer 10 and the conductive multi-layered reflecting mirror 9 may not be a rough surface but a mirror surface.

The reflective layer 11 is made of Ag-containing material. In this embodiment, the reflective layer 11 may be made of an alloy containing Ag, Pd and Cu (an AgPdCu alloy) or alternatively an AgPtCu alloy with Pt in place of Pd. For the AgPdCu alloy, the metal mixing ratio may be such that Ag is about 99%, Pd is 0.6% and Cu is 0.2%. Containing this proportion of Pd and Cu in the alloy can suppress sulfurization which is likely to occur in Ag alone, When viewed from top, the reflective layer 11 is smaller than the adhesive layer 10 and is located inside a region of the adhesive layer 10. Accordingly, a peripheral portion 10A of the adhesive layer 10 is exposed from the reflective layer 11 side (see FIG. 2). Thickness of the reflective layer 11 is about 100 nm.

The barrier metal layer 12 is formed by stacking a titanium/tungsten (TiW) alloy layer and a Pt layer in this order from the reflective layer 11 side. The bonding metal layer 13 is made of Au-containing material. In this embodiment, the bonding metal layer 13 is made of an AuSn alloy. As described above, the barrier metal layer 12 constituted by the TiW alloy layer and the Pt layer is higher in melting point than the bonding metal layer 13. Ire other words, since the barrier metal layer 12 having a melting point higher than that of the bonding metal layer 13 is interposed between the reflective layer 11 (AgPdCu alloy) and the bonding metal layer 13 (AuSn alloy), it is possible to prevent an ingredient (Sn) in the bonding metal layer 13 from being diffused into the reflective layer 11. The thickness of the bonding metal layer 13 is about 2 μm.

The barrier metal layer 12 and the bonding metal layer 13 are formed in the same pattern as the reflective layer 11 when viewed from top. On the other hand, a plurality of convex portions 35 projecting toward the first conductive type semiconductor layer 6 is formed on the front surface 3 of the sapphire substrate 2. These convex portions 35 are separated from one another at predetermined intervals and are discretely arranged on the front surface 3 of the sapphire substrate 2. The whole arrangement of the convex portions 35 may be in a matrix form or a staggered form. The convex portions 35 are made of silicon nitride (SiN). Since the convex portions 35 made of SiN are formed on the front surface 3 of the sapphire substrate 2, it is possible to prevent light, which is reflected from the reflective layer 11 and is incident into the interface between the sapphire substrate 2 and the first conductive type semiconductor layer 6 at different angles, from being totally reflected toward the reflective layer 11 side, which can result in increased efficiency of light extraction.

The first conductive type semiconductor layer 6 is stacked on the front surface 3 of the sapphire substrate 2. The first conductive type semiconductor layer 6 covers the entire front surface 3 of the sapphire substrate 2. The first conductive type semiconductor layer 6 is made of an n-type nitride semiconductor (for example, GaN) and is transparent to the emission wavelength of the light emitting layer 7. For the first conductive type semiconductor layer 6, a lower surface covering the front surface 3 of the sapphire substrate 2 in FIG. 2 is referred to as a rear surface 61 and an upper surface opposite the rear surface 61 is referred to as a front surface 62. The front surface 62 includes a first region 19 lowered by one step toward the rear surface 61 and a second region 20 higher than the first region 19.

When a portion of the first conductive type semiconductor layer 6 in the first region 19 is referred to as a lead portion 21 lead from the semiconductor stacked structure 90, a side surface 22 of the lead portion 21 is led out to a position flush with the side surface 5 of the sapphire substrate 2. Referring to FIG. 1, the lead portion 21 (see a hatched portion in FIG. 1) includes an annular outer peripheral portion 23 surrounding the semiconductor stacked structure 90 and a straight line portion 24 extending linearly across the semiconductor stacked structure 90 from the outer peripheral portion 23.

The straight line portion 24 of the lead portion 21 includes a pad space 25 (for example, a circular space) disposed at the periphery of the semiconductor stacked structure 90 and a wiring space 26 extending linearly in the longitudinal direction of the light emitting element 1. In this embodiment, the pad space 25 is disposed in one longitudinal end portion (the right end in FIG. 1) of the light emitting element 1 and the wiring space 26 extends to the opposite side of the pad space 25 (the left side in FIG. 1) in the longitudinal direction from the pad space 25.

A first electrode 27 is formed on a surface of the lead portion 21 in contact with the lead portion 21. The first electrode 27 includes a first metal wiring 28 laid on the lead portion 21 and a first pad 29 formed on the first metal wing 28 in the pad space 25. The first metal 28 is made of, for example, Al and Cr. In this embodiment, the first metal wiring 28 is constructed by forming Al on the lead portion 21 (the first conductive type semiconductor layer 6) in contact with the lead portion 21 and then forming Cr on Al. The thickness of the first metal wiring 28 is, for example, about 1000 nm.

In this embodiment, the first metal wiring 28 is laid on a part of the outer peripheral portion 23 along the straight line portion 24 and a short side (short side on the right in FIG. 1) of the semiconductor stacked structure 90 close to the pad space 25 of the lead portion 21, and a contact of the first electrode 27 with the first conductive type semiconductor layer 6 is formed by the first metal wiring 28. In addition, the first metal wiring 28 is formed in a disc shape slightly narrower than the width of the pad space 25 in the pad space 25 and is formed in a thin wire shape in the straight line portion 24 (i.e., the wiring space 26) and the outer peripheral portion 23 other than the pad space 25.

Referring to FIG. 3, the first pad 29 is formed in a columnar shape (a cylindrical shape in this embodiment, see FIG. 1) projecting upward beyond the second conductive type semiconductor layer 8 in the pad space 25 and its thickness is, for example, about 1000 nm. The first pad 29 is made of, for example, Ag, a solder or an AuSn. Regarding the first electrode 27, when viewed from top, the first metal wiring 28 crosses the reflective layer 11 in the longitudinal direction (of the light emitting element 1) and faces the reflective layer 11 in the thickness direction of the sapphire substrate 2. However, since the first metal wiring 28 is formed in a thin wire shape (see FIG. 1), the first metal wiring 28 has an insignificant effect on extraction efficiency of light reflected from the reflective layer 11. On the other hand, although the first pad 29 wider than the first metal wiring 28 also faces the reflective layer 11, since the first pad 29 faces only an edge of the reflective layer 11, the first pad 29 has an insignificant effect on extraction efficiency of light reflected from the reflective layer 11, like the first metal wiring 28.

The light emitting layer 7 is stacked on the first conductive type semiconductor layer 6. The light emitting layer 7 covers the entire second region 20 in the front surface 3 of the first conductive type semiconductor layer 6. In this embodiment, the light emitting layer 7 is made of an In-containing nitride semiconductor (for example, InGaN). The second conductive type semiconductor layer 8 is stacked on the light emitting layer 7 in the same pattern as the light emitting layer 7. Accordingly, when viewed from top, a region of the second conductive type semiconductor layer 8 is consistent with a region of the light emitting layer 7. The second conductive type semiconductor layer 8 is made of a p-type nitride semiconductor (for example, GaN) and is transparent to the emission wavelength of the light emitting layer 7. In this manner, a light emitting diode structure (the semiconductor stacked structure 90) is formed, which includes the first conductive type semiconductor layer 6 serving as an n-type semiconductor layer, the second conductive type semiconductor layer 8 serving as a p-type semiconductor layer, and the light emitting layer 7 interposed therebetween.

A transparent electrode layer 30 is formed on the surface of the second conductive type semiconductor layer 8. A contact of a second electrode 31 (which will be described later) for the second conductive type semiconductor layer 8 is formed by the transparent electrode layer 30. The transparent electrode layer 30 is made of material (for example, ITO or ZnO) transparent to the emission wavelength of the light emitting layer 7. The thickness of the transparent electrode layer 30 is, for example, about 1000 nm.

The second electrode 31 is formed on a surface 34 of the transparent electrode layer 30. The second electrode 31 is made of, for example, Ag, a solder or an AuSn alloy. Referring to FIG. 1, the second electrode 31 includes a second pad 32 disposed at the edge of the semiconductor stacked structure 90 and a second metal wiring 33 extending along the side surface of the semiconductor stacked structure 90 from the second pad 32, with the second pad 32 integrated with the second metal wiring 33. In this embodiment, the second pad 32 is disposed in the opposite side of the first pad 29 (the left side in FIG. 1) in the longitudinal direction of the semiconductor stacked structure 90, and a portion of the second metal wiring 33 (a portion extending along the side surface of the semiconductor stacked structure 90) extends in parallel to the first metal wiring 28 on the straight line portion 24. In particular, so as to sandwich the first metal wiring 28 on the straight line portion 24, the second metal wiring 33 is provided one by one in one side and the other side of the first metal wiring 28, and each second metal wiring 33 is integrated with an end portion (the left end in FIG. 1) of the second pad 32 farther from the first pad 29.

Regarding the second electrode 31, since the second metal wiring 33 is placed near the outside of the reflective layer 11 in order not to overlap the reflective layer 11 when viewed from top, the second metal wiring 33 has little effect on extraction efficiency of light reflected from the reflective layer 11. On the other hand, although the second pad 32 faces the reflective layer 11, the second pad 32 is disposed opposite the first pad 29 in the longitudinal direction of the semiconductor stacked structure 90 and faces only an edge of the reflective layer 11. Accordingly, the second pad 32 has an insignificant effect on extraction efficiency of light reflected from the reflective layer 11, like the first pad 29.

Referring to FIG. 3, in the light emitting element 1, when a forward voltage is applied between the second electrode 31 (the second pad 32) and the first electrode 27 (the first pad 29), a current flows from the second electrode 31 toward the first electrode 27. The current flows through the transparent electrode layer 30, the second conductive type semiconductor layer 8, the light emitting layer 7 and the first conductive type semiconductor layer 6 in this order from the second electrode 31 toward the first electrode 27. When the current flows in this way, electrons are injected from the first conductive type semiconductor layer 6 into the light emitting layer 7 and holes are injected from the second conductive type semiconductor layer 8 into the light emitting layer 7. The electrons and the holes are recombined in the light emitting layer 7 to emit blue light having a wavelength of 440 nm to 460 nm. The blue light transmits through the second conductive type semiconductor layer 8 and the transparent electrode layer 30 and is extracted from the surface 34 (light extraction surface) of the transparent electrode layer 30.

Light directed from the light emitting layer 7 toward the first conductive type semiconductor layer 6 transmits through the first conductive type semiconductor layer 6 and the sapphire substrate 2 in this order. This light is reflected at an interface between the sapphire substrate 2 and the conductive multi-layered reflecting mirror 9 and an interface between the SiO₂ layer 17 and the TiO₂ layer 18 in the conductive multi-layered reflecting mirror 9 (an interface between the first multi-layered reflecting mirror portion 91 and the second multi-layered reflecting mirror portion 92 and an interface between the second multi-layered reflecting mirror portion 92 and the third multi-layered reflecting mirror portion 93) (see FIG. 4). The light reflected so transmits through the sapphire substrate 2, the first conductive type semiconductor layer 6, the light emitting layer 7, the second conductive type semiconductor layer 8 and the transparent electrode layer 30 in this order and is extracted from the surface 34. In this manner, each of the conductive multi-layered reflecting mirror 9 and the reflective layer 11 reflects light from the sapphire substrate 2 toward the front surface 3 of the light extraction surface (the surface 34 of the transparent electrode layer 30) side in the sapphire substrate 2.

Here, although the current flows through the transparent electrode layer 30, the second conductive type semiconductor layer 8, the light emitting layer 7 and the first conductive type semiconductor layer 6 from the second electrode 31 toward the first electrode 27, there is no need for the current to flow through the reflective layer 11 in the rear surface 4 side of the sapphire substrate 2. Accordingly, since there is no need for heat treatment to alloy the reflective layer 11 when the reflective layer 11 is formed, the reflectance of the reflective layer 11 is high. In addition, since the reflective layer 11 is made of Ag with addition of Pd and Cu, rather than Ag alone, the reflectance of the reflective layer 11 can be prevented from being reduced due to contact between the reflective layer 11 and the adhesive layer 10.

Figure 6:
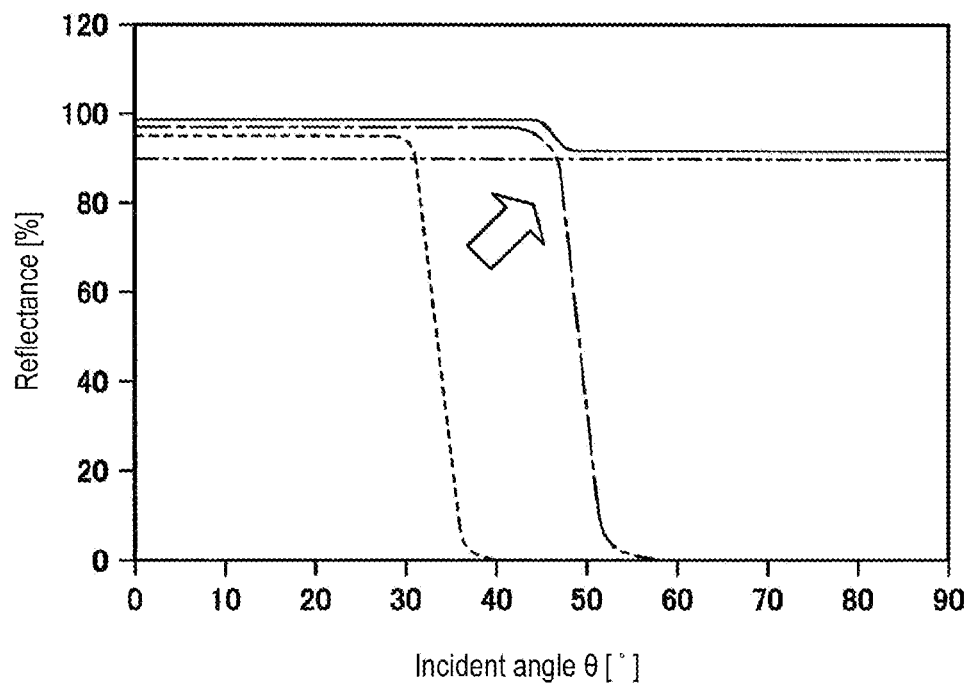
FIG. 6 is a graph showing a relationship between an incident angle and a reflectance of the light emitting element and a conductive multi-layered reflecting mirror.

As described above, the light emitting element 1 has a conductive multi-layered reflecting mirror 9 such as DBR. The DBR is characterized in that light L close to normal incidence has a high reflectance while the reflectance is rapidly decreased after an incident angle θ (see FIG. 3) reaches a predetermined critical angle. FIG. 6 shows a relationship between the incident angle θ and the reflectance, where a conventional DBR is indicated by a dashed line. The conventional DBR has a critical angle of about 35 degrees.

In order to increase the reflectance, there is a need to increase the maximum reflectance (a reflectance in an incident angle range below the critical angle) and extend a wavelength band of light that can be reflected (an adaptable wavelength band). In the conductive multi-layered reflecting mirror 9, the number of reflections of light within the conductive multi-layered reflecting mirror 9 is increased to increase the maximum reflectance. To this end, the number of SiO₂ layers 17 and TiO₂ layers 18 (see FIG. 4) is increased. For example, the total number of layers in the conductive multi-layered reflecting mirror 9 is 29 (=14 pairs of SiO₂ layers 17 and TiO₂ layers 18+one SiO₂ layer 17 on the front surface 15 or the rear surface 16 of the conductive multi-layered reflecting mirror 9).

In order to extend a wavelength band, as described above, the conductive multi-layered reflecting mirror 9 employs a plurality of multi-layered reflecting portions (in this embodiment, the first multi-layered reflecting mirror portion 91, the second multi-layered reflecting mirror portion 92 and the third multi-layered reflecting mirror portion 93) having different individual thicknesses and different total thicknesses of the SiO₃ layers 17 and the TiO₂ layers 18. Although it is ideal that the total number of layers of each of the first multi-layered reflecting mirror portion 91, the second multi-layered reflecting mirror portion 92 and the third multi-layered reflecting mirror portion 93 is 29, in this embodiment, the 29 layers are divided into three parts, i.e., the first multi-layered reflecting mirror portion 91, the second multi-layered reflecting mirror portion 92 and the third multi-layered reflecting mirror portion 93. Thus, for example, the first multi-layered reflecting mirror portion 91 can reflect a long wavelength band of light, the second multi-layered reflecting mirror portion 92 can reflect an intermediate wavelength band of light, and the third multi-layered reflecting mirror portion 93 can reflect a short wavelength band of light.

Figure 7:
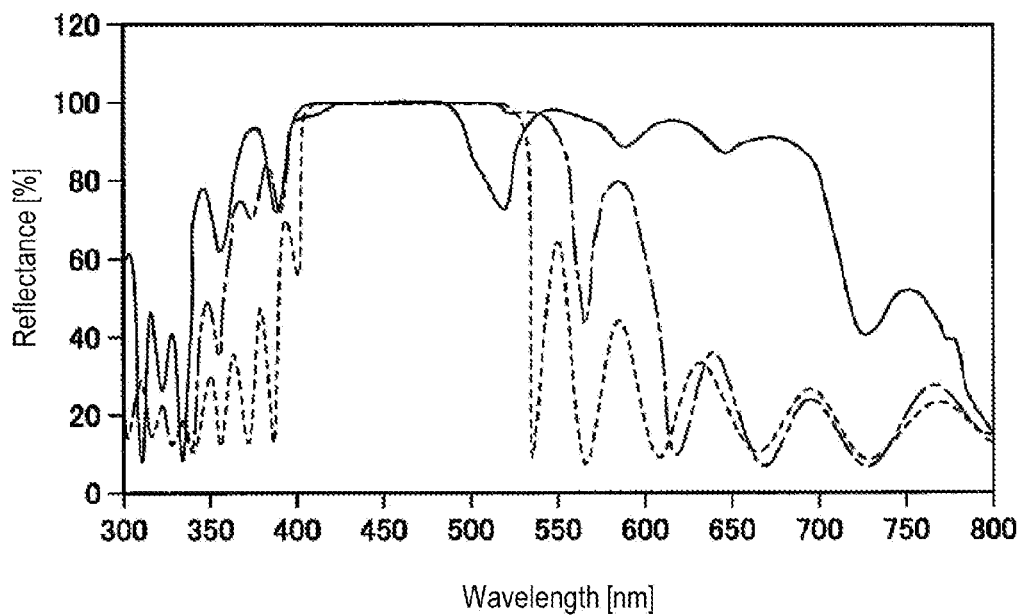
FIG. 7 is a graph showing a relationship between a wavelength and a reflectance in the conductive multi-layered reflecting mirror.

FIG. 7 shows a relationship between a light wavelength and a reflectance in the conductive multi-layered reflecting mirror 9. A case where the thickness of each of the SiO₂ layer 17 and the TiO₂ layer 18 in the conductive multi-layered reflecting mirror 9 is constant (the first multi-layered reflecting mirror portion 91, the second multi-layered reflecting mirror portion 92 and the third multi-layered reflecting mirror portion 93 have the same configuration) is indicated by a dotted line, in which case a wavelength band is within a range of about 410 nm to 520 nm. As in this embodiment, a case where the thickness of each of the SiO₂ layer 17 and the TiO₂ layer 18 in the first multi-layered reflecting mirror portion 91, the second multi-layered reflecting mirror portion 92 and the third multi-layered reflecting mirror portion 93 is changed by about 10% (a case where thicknesses of other multi-layered reflecting mirror portions are changed by ±10% with respect to the second multi-layered reflecting mirror portion 92) is indicated by a one-dot chain line, in which case a wavelength band is extended to a range of about 400 nm to 550 nm. On the other hand, a case where the thickness of each of the SiO₂ layer 17 and the TiO₂ layer 18 in the first multi-layered reflecting mirror portion 91, the second multi-layered reflecting mirror portion 92 and the third multi-layered reflecting mirror portion 93 is changed by about 20% (a case where thicknesses of other multi-layered reflecting mirror portions are changed by ±20% with respect to the second multi-layered reflecting mirror portion 92) is indicated by a solid line, in which case a wavelength band may be extended but a reflectance is locally reduced in a range of 500 nm to 520 nm and is unstable. Therefore, in this embodiment, the total number of layers in the conductive multi-layered reflecting mirror 9 is set to 29 and the thickness of each of the SiO₂ layer 17 and the TiO₂ layer 18 in the first multi-layered reflecting mirror portion 91, the second multi-layered reflecting mirror portion 92 and the third multi-layered reflecting mirror portion 93 is changed by about 10%.

By employing such a conductive multi-layered reflecting mirror 9, referring to FIG. 6, a critical angle is increased from 35 degrees to 50 degrees (see a white arrow in FIG. 6), as indicated by a one-dot chain line, in comparison to the conventional DBR. That is, the conductive multi-layered reflecting mirror 9 can also increase the reflectance and can also reflect a wide wavelength band of light. In FIG. 6, a two-dot chain line indicates the reflectance of the reflective layer 11 which is fixed at about 90% over the entire range of an incident angle 8. In FIG. 6, a solid line indicates the reflectance of the entire light emitting element 1 which corresponds to the sum of a line of higher reflectance (one of the one-dot chain line and the two-dot chain line) in the conductive multi-layered reflecting mirror 9 and the reflective layer 11 for each range of the incident angle θ. In the range of the incident angle θ until a critical angle of 50 degrees, a reflectance of the conductive multi-layered reflecting mirror 9 is higher than that of the reflective layer 11. On the other hand, in the range of the incident angle θ exceeding the critical angle of 50 degrees, a reflectance of the reflective layer 11 is higher than that of the conductive multi-layered reflecting mirror 9.

Speaking strictly, the solid line indicating the reflectance of the entire light emitting element 1 overlaps corresponding portions of the one-dot chain line or the two-dot chain line. However, for convenience of explanation, the solid line is shown in FIG. 6 to be separated from the one-dot chain line or the two-dot chain line. Next, a method of manufacturing the light emitting element 1 will be described by way of example. In the method of manufacturing the light emitting element 1 shown in FIG. 3, for example, a layer made of SiN (SiN layer) is formed on a front surface of a substrate wafer (for example, a wafer having a thickness of 600 μm to 1000 μm) and the SiN layer is separated into a plurality of concave portions 35 by an etching process using a resist pattern (not shown) as a mask. Then, the semiconductor stacked structure 90 is formed by epitaxially growing the first conductive type semiconductor layer 6, the light emitting layer 7 and the second conductive type semiconductor layer 8 on the front surface of the substrate wafer so as to cover these convex portions 35. Next, the transparent electrode layer 30 is formed by depositing a material (ITO or the like) for the transparent electrode layer 30 on the semiconductor stacked structure 90 by, for example, a sputtering process.

Next, the transparent electrode layer 30 and the semiconductor stacked structure 90 are etched using a predetermined patterned mask. Thus, the semiconductor stacked structure 90 is formed in a predetermined shape (a rectangular shape when viewed from top) and, at the same time, the lead portion 21 being an extension of the first conductive type semiconductor layer 6 is formed. Next, the first electrode 27 is formed on the lead portion 21 (the first conductive type semiconductor layer 6) and the second electrode 31 is formed on the transparent electrode layer 30.

Thereafter, with the front surface of the substrate wafer protected, a rear surface of the substrate wafer is polished to reach a thickness of 200 μm to 300 μm. Next, the conductive multi-layered reflecting mirror 9 is formed by alternately stacking the $SiO_2$ layer 17 and the $TiO_2$ layer 18 on the rear surface of the substrate wafer according to the above-described second pattern. Next, the adhesive layer 10 is formed on the entire rear surface 16 of the conductive multi-layered reflecting mirror 9. Then, the reflective layer 11 is formed by depositing a material (an AgPdCu alloy or the like) for the reflective layer 11 on the entire rear surface 16 of the adhesive layer 10 by, for example, a sputtering process.

Subsequently, a resist pattern (not shown) covering only a region having a predetermined width on a cutting line of the substrate wafer in the reflective layer 11 is formed on the rear surface of the reflective layer 11, and a material (an TiW alloy or the like) for the barrier metal layer 12 and a material (an AuSn alloy or the like) for the bonding metal layer 13 are deposited in this order using the resist pattern. Then, unnecessary portions of the materials for the barrier metal layer 12 and the bonding metal layer 13 are lifted off together with the resist pattern. Then, the barrier metal layer 12 and the bonding metal layer 13 are formed in such a manner to selectively expose a portion of the reflective layer 11 along the cutting line. Next, the portion of the reflective layer 11 exposed from the barrier metal layer 12 and the bonding metal layer 13 is removed (etched away) by, for example, a dry etching process. Thus, the peripheral portion 10A of the adhesive layer 10 is selectively exposed along the cutting line.

Next, a laser machine is used to scan the substrate wafer with laser light from its rear surface. Thus, division guide grooves reaching the middle of the substrate wafer through the adhesive layer 10 are formed. Thereafter, an external force is applied to the substrate wafer to divide the substrate wafer into individual light emitting elements 1 (chips), with the division guide grooves as boundaries, thereby segmenting the light emitting element 1 of FIG. 3.

Alternatively, a laser scriber or the like may be used to cut (dice) the substrate wafer along the cutting line to divide the substrate wafer into individual light emitting elements 1, without exposing the peripheral portion 10A of the adhesive layer 10. In this case, unlike the exposure of the peripheral portion 10A of the adhesive layer 10 in FIG. 3, the adhesive layer 10, the reflective layer 11, the barrier metal layer 12 and the bonding metal layer 13 have the same pattern when viewed from top.

Figure 8:
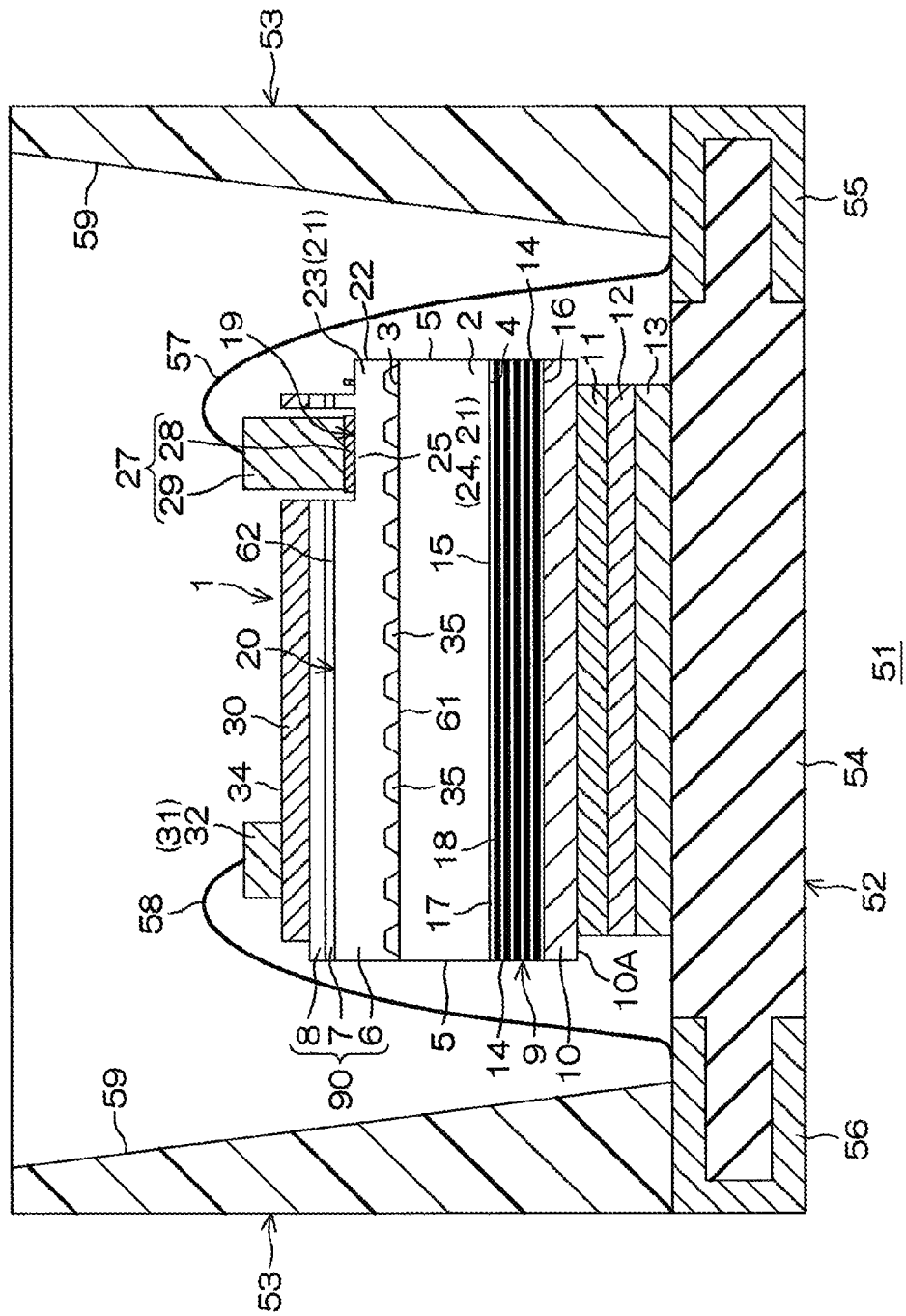
FIG. 8 is a schematic sectional view of a light emitting element package.

FIG. 8 is a schematic sectional view of a light emitting element package 51. The light emitting element package 51 includes the light emitting element 1, a supporting substrate 52 and a package 53. The supporting substrate 52 may be regarded as a part of the package 53. The light emitting element 1 is disposed on the supporting substrate 52 when the bonding metal layer 13 is bonded to the supporting substrate 52. At that time, the light emitting element 1 has a face-up posture where the front surface 3 of the sapphire substrate 2 faces upward.

The supporting substrate 52 includes an insulating substrate 54 supporting the light emitting element 1, and a pair of metal electrodes (a first external electrode 55 and a second external electrode 56) exposed at both ends of the insulating substrate 54 and electrically connecting the light emitting element 1 to an external components (not shown). The first electrode 27 (the first pad 29) of the light emitting element 1 and the first external electrode 55 are interconnected by a first wire 57. The second electrode 31 (the second pad 32) of the light emitting element 1 and the second external electrode 56 are interconnected by a second wire 58.

The package 53 is a case filled with resin and is fixed to the supporting substrate 52 under a state where the package 53 accommodates and protects (covers) the light emitting element 1. Under this state, the front surface 3 of the sapphire substrate 2 is exposed in the light emitting element 1. The package 53 has a reflecting portion 59 which is formed on a surface of its lateral side (portion facing the light emitting element 1) and is made of, for example, Ag plating. Light emitted from the light emitting element 1 is reflected by the reflecting portion 59 and is externally extracted.

The resin constituting the package 53 may contain a fluorescent material and a reflection agent. For example, if the light emitting element 1 emits blue light, the light emitting element package 51 can emit white light by containing a yellow fluorescent material in the resin. A plurality of light emitting element packages 51 may be combined for use in lighting devices such as electric bulbs, backlights for liquid crystal TVs, vehicle head lamps and so on.

Figure 9:
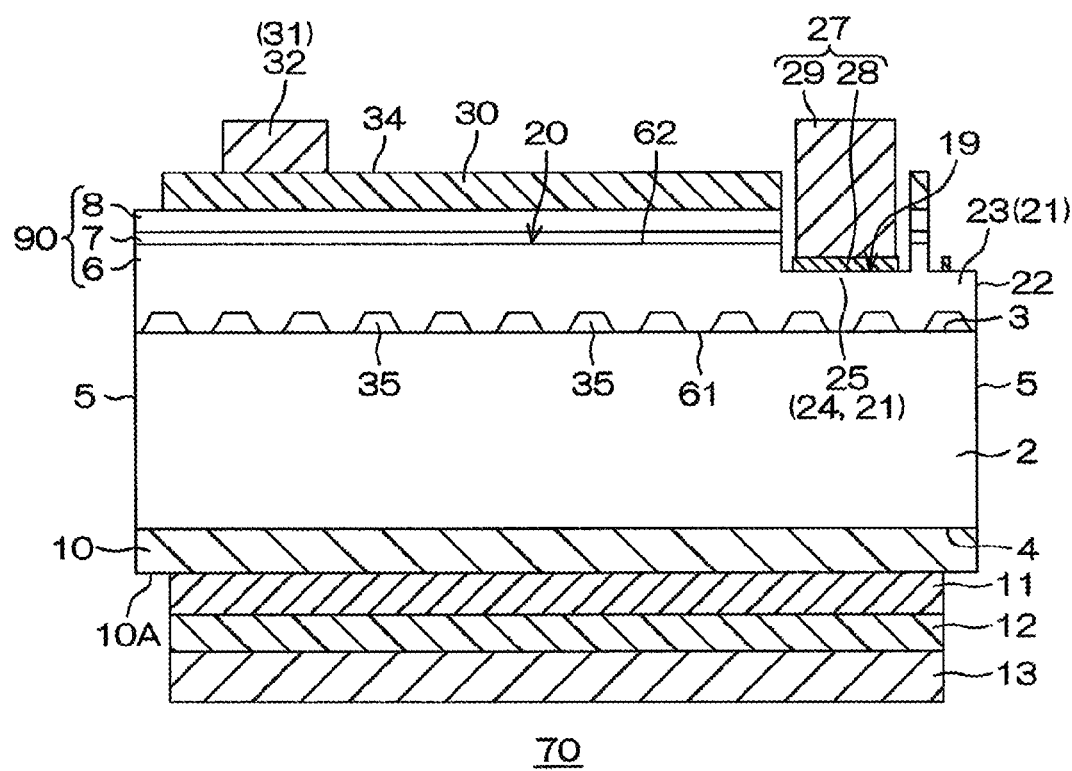
FIG. 9 is a schematic sectional view of a light emitting element according to a modification.

In addition, as shown in FIG. 9, a light emitting element 70 where the conductive multi-layered reflecting mirror 9 is excluded from the above-described light emitting element 1 may be employed. In the light emitting element 70, the same elements as the above-described light emitting element 1 are denoted by the same reference numerals and further explanation of which will not be repeated. In the light emitting element 70, only the adhesive layer 10 is present between the reflective layer 11 and the sapphire substrate 2 and adheres the reflective layer 11 to the rear surface 4 of the sapphire substrate 2. In order to increase an adhesion between the sapphire substrate 2 and the adhesive layer 10, an interface between the sapphire substrate 2 and the adhesive layer 10 may have a rough surface. A method of manufacturing the light emitting element 70 has the same configuration as the above-described method of manufacturing the light emitting element 1 except a process of manufacturing the conductive multi-layered reflecting mirror 9 is excluded from the latter. The above-described light emitting element package 51 (see FIG. 8) includes the light emitting element 70, the supporting substrate 52 and the package 53.

In the above-described light emitting elements 1 and 70, light from the light emitting layer 7 can be instantly released from the front surface 3 of the sapphire substrate 2 or may be released from the front surface 3 of the sapphire substrate 2 after once transmitting through the adhesive layer 10 and being reflected by the reflective layer 11. Since the reflective layer 11 contains Ag higher in reflectance than Al, the reflectance of the reflective layer 11 can be increased and the brightness of the light emitting element 1 can be accordingly increased. On the other hand, by interposing the adhesive layer 10 made of ITO between the Ag-containing reflective layer 11 and the sapphire substrate 2, it is possible to increase the adhesion between the reflective layer 11 and the sapphire substrate 2.

In addition, the adhesive layer 10 has a very small thickness of 20 nm or less so as to increase the permeability of light in the adhesive layer 10, which will allow more light to be reflected from the reflective layer 11 thereby increasing the brightness of the light emitting element 1.

In addition, heat generated from the light emitting element 1 by emission of the light emitting layer 7 can be effectively dissipated (to the package 53 side) by the Au-containing bonding metal layer 13 having a high thermal conductivity. That is, it is possible to achieve high heat dissipation of the light emitting element 1.

In addition, for the light emitting element 1 shown in FIG. 3, since the conductive multi-layered reflecting mirror 9 also exists in addition to the reflective layer 11 for light reflection, light reflectance can be increased over the presence of the reflective layer 11 alone and the bright ness of the light emitting element 1 can be further increased as much. Furthermore, the adhesive layer 10 can provide an increased adhesion between the conductive multi-layered reflecting mirror 9 and the reflective layer 11.

In addition, for the light emitting element 1 shown in FIG. 9, since the adhesive layer 10 adheres the reflective layer 11 to the rear surface 4 of the sapphire substrate 2, it is possible to increase the adhesion between the reflective layer 11 and the sapphire substrate 2. To demonstrate effects of brightness and heat dissipation for the light emitting elements 1 and 70, light emitting elements 80 and 81 according to comparative examples were prepared. In the light emitting elements 80 and 81, the same elements as the light emitting elements 1 and 70 are denoted by the same reference numerals and further explanation of which will not be repeated.

Figure 10:
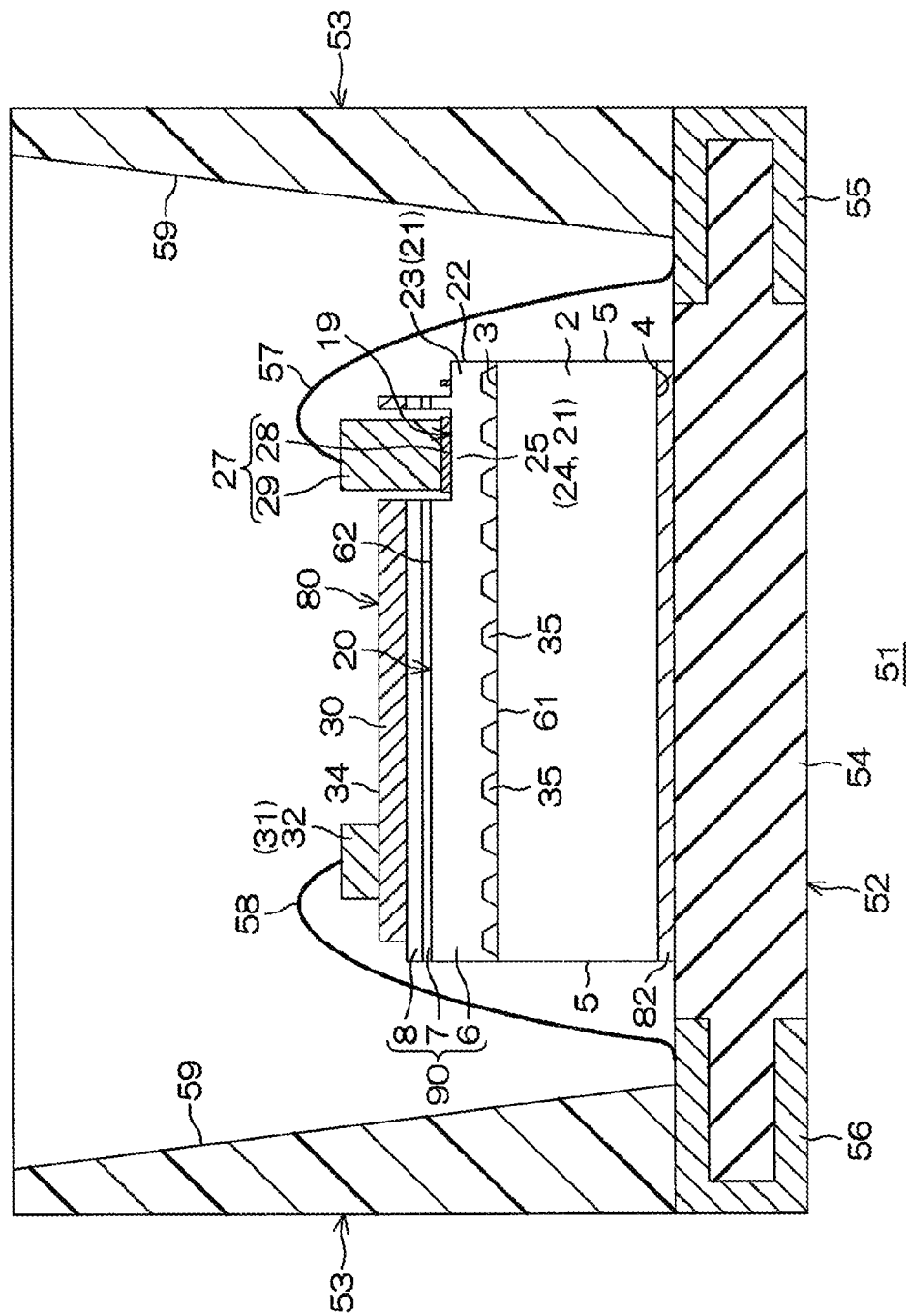
FIG. 10 is a schematic sectional view of a light emitting element package to which a light emitting element according to a first comparative example is applied.

Referring to FIG. 10, the light emitting element 80 according to a first comparative example has a configuration where the conductive multi-layered reflecting mirror 9, the adhesive layer 10, the reflective layer 11, the barrier metal layer 12 and the bonding metal layer 13 are excluded from the light emitting elements 1 and 70 (see FIGS. 3 and 9). Accordingly, in the light emitting element 80 alone, nothing is formed on the rear surface 4 of the sapphire substrate 2. The light emitting element 80 is bonded to the supporting substrate 52 of the package 53 by a paste agent 82 such as an epoxy resin or the like coated on the rear surface 4 of the sapphire substrate 2. For the light emitting element 80, when the light emitting layer 7 emits light, the light transmits through the sapphire substrate 2 and is reflected from the reflecting portion 59 of the package 53 instead of being reflected within the light emitting element 80.

Figure 11:
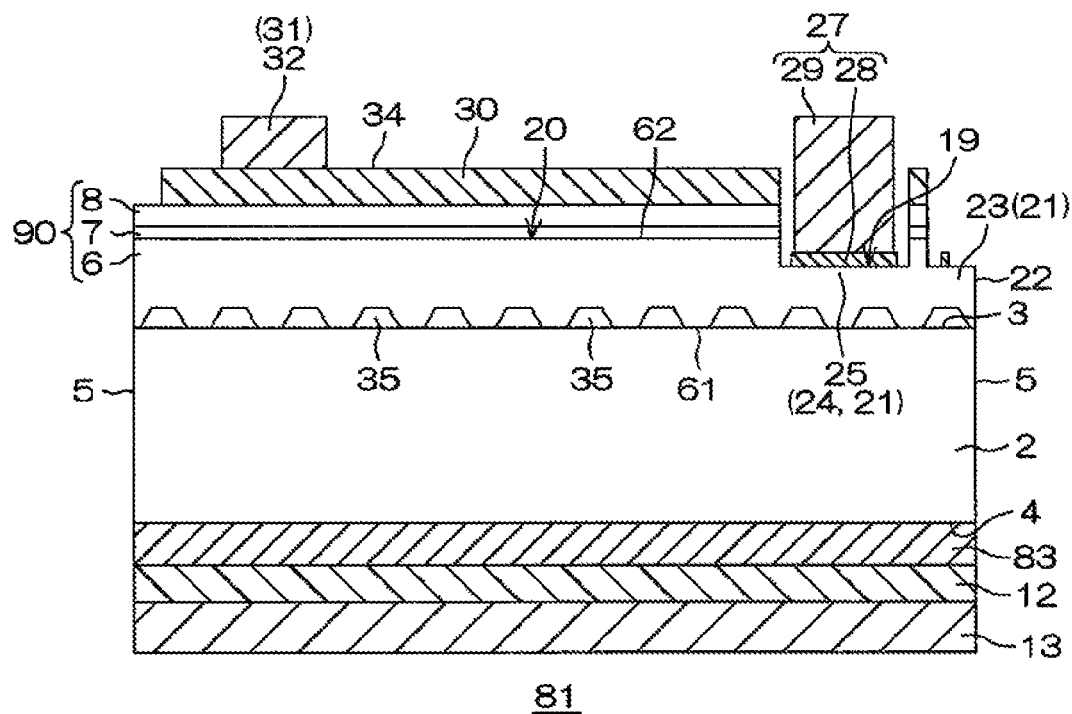
FIG. 11 is a schematic sectional view of a light emitting element according to a second comparative example.

Referring to FIG. 11, the light emitting element 81 according to a second comparative example has a configuration where the conductive multi-layered reflecting mirror 9, the adhesive layer 10 and the reflective layer 11 are excluded from the light emitting elements 1 and 70 and, instead, a reflective layer 83 made of Al is employed (see FIGS. 3 and 9). Accordingly, in the light emitting element 81, the reflective layer 83, the barrier metal layer 12 and the bonding metal layer 13 are stacked in this order on the rear surface 4 of the sapphire substrate 2. The thickness of the reflective layer 83 is, for example, about 100 nm. The reflectance of the reflective layer 83 made of Al is lower than those of the Ag-containing reflective layers 11 of the light emitting elements 1 and 70. For the light emitting element 81, when the light emitting layer 7 emits light, the light directing to the sapphire substrate 2 transmits through the sapphire substrate 2 and is reflected at an interface between the sapphire substrate 2 and the reflective layer 83.

In the light emitting element 80, a specific value of reflectance for light having a wavelength of 450 nm amounts to 93% by virtue of the reflecting portion 59 (plated with Ag) of the package 53 (see FIG. 10). On the other hand, the light emitting element 81 having the reflective layer 83 made of Al has a reflectance of 86% in case of a single element. In addition, the light emitting element 70 (see FIG. 9) having the reflective layer 11 made of AgPdCu has a reflectance of 91% in case of a single element. In addition, the light emitting element 1 (see FIG. 3) having the conductive multi-layered reflecting mirror 9 in addition to the reflective layer 11 has the highest reflectance of 95% in case of a single element.

Figure 12:
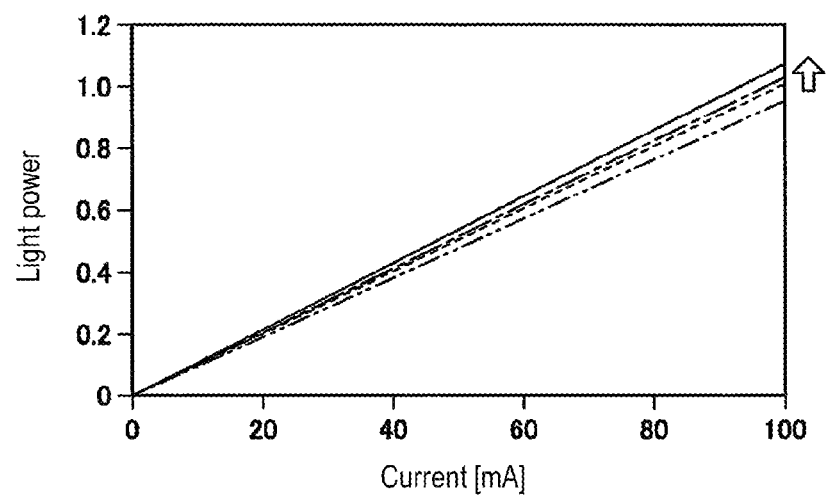
FIG. 12 is a graph showing a relationship between current and light power in the light emitting element.

FIG. 12 shows a relationship between current and light power (a representation of brightness as an index) of the light emitting elements 1, 70, 80 and 81 through which the current flows. It can be seen from this figure that the light emitting element 1 (indicated by a solid line) and the light emitting element 70 (indicated by a one-dot chain line) have increased light power over the light emitting element 80 (indicated by a dotted line) having no light reflecting structure. In particular, the light emitting element 1 having the structure where the conductive multi-layered reflecting mirror 9 is added to the light emitting element 70 has the highest light power which is higher by 4% than that of the light emitting element 80 (see a white arrow). In addition, the light power of the light emitting element 81 (indicated by a two-dot chain line) having the reflective layer 83 lower in reflectance than the light emitting layers 7 of the light emitting elements 1 and 70 is lower than that of the light emitting element 80 (indicated by the dotted line).

Figure 13:
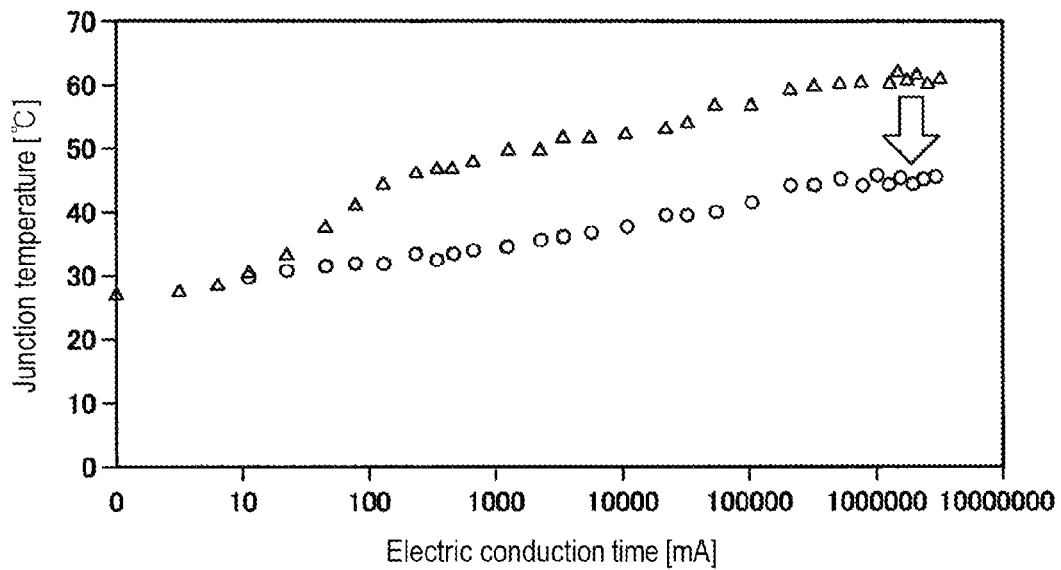
FIG. 13 is a graph showing a relationship between electric conduction time and junction temperature in the light emitting element.

With regard to actual brightness characteristics, assuming that the light power of the light emitting element 80 is 1.00, the light power of the light emitting element 81 is lowered to 0.91, the light power of the light emitting element 70 is 1.00, and the light power of the light emitting element 1 has the highest value of 1.04. FIG. 13 shows a relationship between electric conduction time and junction temperature (temperature of light emitting elements) when a predetermined current (for example, 100 mA) continues to flow. Lower junction temperature provides better heat dissipation. The light emitting elements 1, 70 and 81 (indicated by circular points) having the bonding metal layer 13 are lower in junction temperature (the maximum of 20 degrees C., see a white arrow) and better in heat dissipation than the light emitting element 80 (indicated by triangular points) having no bonding metal layer 13. In the light emitting element 80, since it is likely to be filled with heat, the above-mentioned paste agent 82 (see FIG. 10) is likely to thermally deteriorate and be cloudy, which may result in further decreased reflectance.

Figure 14:
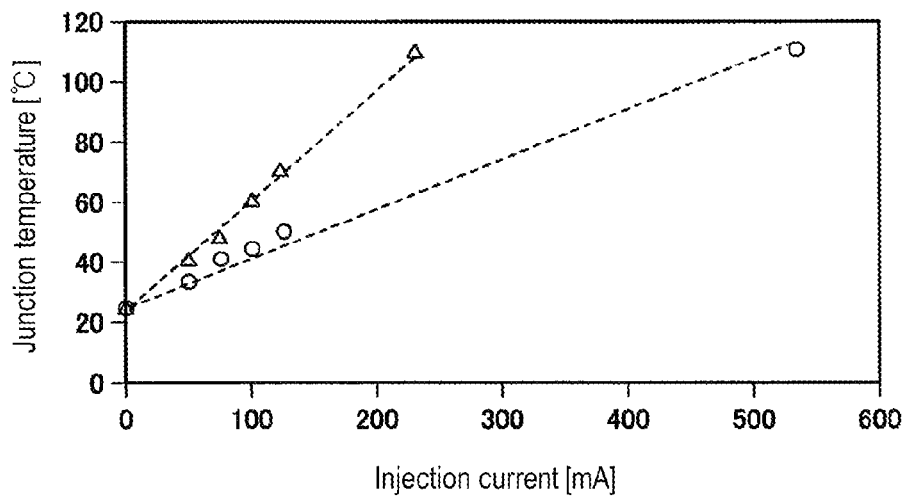
FIG. 14 is a graph showing a relationship between injection current and junction temperature in the light emitting element.

FIG. 14 shows a relationship between injection current and junction temperature when the injection current is increased. The light emitting elements 1, 70 and 81 (indicated by circular points) having the bonding metal layer 13 have good heat dissipation and thus can inject a current about two times as high as that of the light emitting element 80 (indicated by triangular points) having no bonding metal layer 13 until the light emitting elements 1, 70 and 81 reach a predetermined junction temperature. For example, the heat dissipation of the light emitting elements 1, 70 and 81 having the bonding metal layer 13 is advantageously 14 degrees C/W, whereas the heat dissipation of the light emitting element 80 having no bonding metal layer 13 is 51 degrees C/W.

When the light emitting elements 1, 70 and 81 have the bonding metal layer 13, the adhesion between the light emitting elements 1, 70 and 81 and the package 53 (the supporting substrate 52) can be secured enough to withstand a force of 500 gf or more. Although the embodiments of the present disclosure have been illustrated in the above, the present disclosure may be embodied in different forms.

For example, in the light emitting element package 51 shown in FIG. 8, although the light emitting element 1 has the bonding metal layer 13, the supporting substrate 52 of the package 53 may have the bonding metal layer 13. In this case, in the light emitting element 1, the reflective layer 11 is bonded to the bonding metal layer 13 of the package 53 side. Even in this case, the above-mentioned barrier metal layer 12 may be interposed between the reflective layer 11 and the bonding metal layer 13 in order to prevent an ingredient (Sn) of the bonding metal layer 13 from being diffused into the reflective layer 11. In addition, the package 53 may have the barrier metal layer 12 in addition to the bonding metal layer 13 and the reflective layer 11 of the light emitting element 1 may be bonded to the barrier metal layer 12 stacked on the bonding metal layer 13 of the package 53 side.

In addition, in the above-described light emitting element 1, the conductive multi-layered reflecting mirror 9, the adhesive layer 10, the reflective layer 11, the barrier metal layer 12 and the bonding metal layer 13 are stacked in this order on the rear surface 4 of the sapphire substrate 2. That is, although the reflective layer 11 is adhered to the conductive multi-layered reflecting mirror 9 of the sapphire substrate 2 side by the adhesive layer 10, the adhesive layer 10 may be omitted. In this case, the conductive multi-layered reflecting mirror 9 also functions as an adhesive layer to adhere the reflective layer 11 to the sapphire substrate 2.

Although it has been illustrated in the above embodiments that the first conductive type is an n-type and the second conductive type is a p-type, a light emitting element having the first conductive type as a p-type and the second conductive type as an n-type may be formed. That is, a structure obtained by inverting a conductive type between a p-type and an n-type in the above embodiments corresponds to one embodiment of the present disclosure. In addition, although it has been illustrated in the above embodiments that GaN is used as a nitride semiconductor constituting the first conductive type semiconductor layer and the second conductive semiconductor layer in the above embodiments, other nitride semiconductors such as aluminum nitride (AlN), indium nitride (InN) and the like may be used. Nitride semiconductors may have the general chemical formula of $Al_xIn_yGa_{1-x-y}N$ ($0 \leq x \leq 1$, $0 \leq y \leq 1$, $0 \leq x+y \leq 1$). In addition, the present disclosure may be applied to other compound semiconductors such as GaAs and the like and semiconductor materials (for example, diamond) other than the compound semiconductors, without being limited to the nitride semiconductors.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A light emitting element comprising:
   a sapphire substrate having a front surface and a rear surface opposite the front surface;
   a first conductive type semiconductor layer stacked on the front surface of the sapphire substrate;
   a light emitting layer stacked on the first conductive type semiconductor layer;
   a second conductive type semiconductor layer stacked on the light emitting layer;
   a reflective layer which contains Ag and is disposed on a rear side of the sapphire substrate, the reflective layer reflecting light from the sapphire substrate toward the front surface of the sapphire substrate;
   an adhesive layer which is interposed between the sapphire substrate and the reflective layer and is made of ITO, the adhesive layer being directly adhered to the reflective layer;
   at least one electrode disposed on a front side of the sapphire substrate; and
   a multi-layered reflecting mirror which is provided directly on the rear surface of the sapphire substrate and contacts the adhesive layer, and including a first reflecting portion having first and second layers, a second reflecting portion having third and fourth layers, and a third reflecting portion having fifth and sixth layers,
   wherein the sapphire substrate is interposed between the at least one electrode and the reflective layer,
   wherein a thickness of each of the first reflecting portion, the second reflecting portion, and the third reflecting portion is formed based on a pattern, and
   wherein the reflective layer is formed to be inside of the sapphire substrate in a plan view, and ends of the reflective layer are formed not to be flush with ends of the sapphire substrate.

2. The light emitting element of claim 1, wherein the adhesive layer has a thickness of equal to or less than 20 nm.

3. The light emitting element of claim 1, wherein the adhesive layer adheres the reflective layer to the rear surface of the sapphire substrate.

4. The light emitting element of claim 1, further comprising a bonding metal layer, which is disposed opposite of the adhesive layer, with respect to the reflective layer and contains Au.

5. The light emitting element of claim 4, wherein the bonding metal layer is made of AuSn.

6. The light emitting element of claim 4, further comprising a barrier metal layer which is interposed between the reflective layer and the bonding metal layer and is higher in melting point than the bonding metal layer.

7. The light emitting element of claim 1, further comprising a bonding metal layer disposed opposite of the adhesive layer with respect to the reflective layer, and contains Au.

8. The light emitting element of claim 7, wherein the bonding metal layer is made of AuSn.

9. The light emitting element of claim 7, further comprising a barrier metal layer which is interposed between the reflective layer and the bonding metal layer and is higher in melting point than the bonding metal layer.

10. The light emitting element of claim 1, wherein the first reflecting portion, the second reflecting portion, and the third reflecting portion are formed based upon the pattern so that a thickness of the first reflecting portion, a thickness of the second reflecting portion, and a thickness of the third reflecting portion are equal to each other.

11. The light emitting element of claim 10, wherein
the first reflecting portion includes a first layer thickness of the first layer, and a second layer thickness of the second layer,
the second reflecting portion includes a third layer thickness of the third layer, and a fourth layer thickness of the fourth layer,
the third reflecting portion includes a fifth layer thickness of the fifth layer, and a sixth layer thickness of the sixth layer,
the first layer thickness, the third layer thickness, and the fifth layer thickness are equal to each other, and
the second layer thickness, the fourth layer thickness, and the sixth layer thickness are equal to each other.

12. The light emitting element of claim 10, wherein
the first reflecting portion includes a first layer thickness of the first layer, and a second layer thickness of the second layer,
the second reflecting portion includes a third layer thickness of the third layer, and a fourth layer thickness of the fourth layer,
the third reflecting portion includes a fifth layer thickness of the fifth layer, and a sixth layer thickness of the sixth layer,
the first layer thickness, the third layer thickness, and the fifth layer thickness are different from each other, and
the second layer thickness, the fourth layer thickness, and the sixth layer thickness are different from each other.

13. The light emitting element of claim 1, wherein the first reflecting portion, the second reflecting portion, and the third reflecting portion are formed based upon the pattern so that a thickness of the first reflecting portion is larger than a thickness of the second reflecting portion, and the thickness of the second reflecting portion is larger than a thickness of the third reflecting portion.

14. The light emitting element of claim 1, wherein the multi-layered reflective mirror disposed between the adhesive layer and transparent substrate.

15. The light emitting element of claim 1, wherein a length of the reflective layer adhered to the adhesive layer is shorter than a length of the adhesive layer such that a peripheral portion of the adhesive layer is exposed.

16. A light emitting element package comprising:
a light emitting element including:
a sapphire substrate having a front surface and a rear surface opposite the front surface;
a first conductive type semiconductor layer stacked on the front surface of the sapphire substrate;
a light emitting layer stacked on the first conductive type semiconductor layer;
a second conductive type semiconductor layer stacked on the light emitting layer;
a reflective layer which contains Ag and is disposed on a rear side of the sapphire substrate, the reflective layer reflecting light from the sapphire substrate toward the front surface of the sapphire substrate;
an adhesive layer which is interposed between the sapphire substrate and the reflective layer and is made of ITO, the adhesive layer being directly adhered to the reflective layer;
at least one electrode disposed on a front side of the sapphire substrate; and
a multi-layered reflecting mirror which is provided directly on the rear surface of the sapphire substrate and contacts the adhesive layer, and including a first reflecting portion having first and second layers, a second reflecting portion having third and fourth layers, and a third reflecting portion having fifth and sixth layers,
wherein the sapphire substrate is interposed between the at least one electrode and the reflective layer, and
wherein a thickness of each of the first reflecting portion, the second reflecting portion, and the third reflecting portion is formed based on a pattern; and
a package covering the light emitting element in such a manner to visibly expose the front surface of the sapphire substrate,
wherein the reflective layer is formed to be inside of the sapphire substrate in a plan view, and ends of the reflective layer are formed not to be flush with ends of the sapphire substrate.

17. The light emitting element package of claim 16, wherein the multi-layered reflective mirror disposed between the adhesive layer and transparent substrate.

18. The light emitting element package of claim 16, wherein a length of the reflective layer adhered to the adhesive layer is shorter than a length of the adhesive layer such that a peripheral portion of the adhesive layer is exposed.

19. A light emitting element package comprising:
a light emitting element including:
a sapphire substrate having a front surface and a rear surface opposite the front surface;
a first conductive type semiconductor layer stacked on the front surface of the sapphire substrate;
a light emitting layer stacked on the first conductive type semiconductor layer;
a second conductive type semiconductor layer stacked on the light emitting layer;
a reflective layer which contains Ag and is disposed on a rear side of the sapphire substrate, the reflective layer reflecting light from the sapphire substrate toward the front surface of the sapphire substrate;
an adhesive layer which is interposed between the sapphire substrate and the reflective layer and is made of ITO, the adhesive layer being directly adhered to the reflective layer;
at least one electrode disposed on a front side of the sapphire substrate; and
a multi-layered reflecting mirror which is provided directly on the rear surface of the sapphire substrate and contacts the adhesive layer, and including a first reflecting portion having first and second layers, a second reflecting portion having third and fourth layers, and a third reflecting portion having fifth and sixth layers, wherein the sapphire substrate is interposed between the at least one electrode and the reflective layer, and wherein a thickness of each of the first reflecting portion, the second reflecting portion, and the third reflecting portion is formed based on a pattern; and a package covering the light emitting element in such a manner to visibly expose the front surface of the sapphire substrate, wherein the light emitting element includes a bonding metal layer which contains Au and is bonded to the reflective layer, and wherein the reflective layer is formed to be inside of the sapphire substrate in a plan view, and ends of the reflective layer are formed not to be flush with ends of the sapphire substrate.

20. The light emitting element package of claim 19, further comprising a barrier metal layer which is interposed between the reflective layer and the bonding metal layer and is higher in melting point than the bonding metal layer.

21. The light emitting element package of claim 20, wherein the light emitting element includes the barrier metal layer.

22. The light emitting element package of claim 19, wherein the multi-layered reflective mirror disposed between the adhesive layer and transparent substrate.

23. The light emitting element package of claim 19, wherein a length of the reflective layer adhered to the adhesive layer is shorter than a length of the adhesive layer such that a peripheral portion of the adhesive layer is exposed.

24. A light emitting element comprising:
a transparent substrate having a front surface and a rear surface opposite the front surface;
a first conductive type semiconductor layer stacked on the front surface of the transparent substrate;
a light emitting layer stacked on the first conductive type semiconductor layer;
a second conductive type semiconductor layer stacked on the light emitting layer;
a reflective layer which is disposed on the rear surface of the transparent substrate, the reflective layer reflecting light from the transparent substrate toward the front surface of the transparent substrate;
an adhesive layer which is interposed between the transparent substrate and the reflective layer, the adhesive layer being adhered to the reflective layer; and,
a multi-layered reflective mirror disposed between the adhesive layer and transparent substrate,
wherein the reflective layer is formed to be inside of the transparent substrate in a plan view, and ends of the reflective layer are formed not to be flush with ends of the transparent substrate.

25. The light emitting element of claim 24, wherein the multi-layered reflecting mirror is provided directly on the rear surface of the transparent substrate and contacts the adhesive layer, and includes a first reflecting portion having first and second layers, a second reflecting portion having third and fourth layers, and a third reflecting portion having fifth and sixth layers.

26. The light emitting element of claim 24, wherein a thickness of each of the first reflecting portion, the second reflecting portion, and the third reflecting portion is formed based on a pattern.

27. The light emitting element of claim 24, wherein the reflective layer contains Ag.

28. The light emitting element of claim 24, wherein the adhesive layer is made of ITO.

29. The light emitting element of claim 24, further comprising at least one electrode disposed on a front side of the sapphire substrate, wherein the sapphire substrate is interposed between the at least one electrode and the reflective layer.

30. The light emitting element of claim 24, wherein a length of the reflective layer adhered to the adhesive layer is shorter than a length of the adhesive layer such that a peripheral portion of the adhesive layer is exposed.

* * * * *